United States Patent [19]

Weaver

[11] Patent Number: 4,535,320

[45] Date of Patent: Aug. 13, 1985

[54] METHOD AND APPARATUS FOR DIGITAL HUFFMAN DECODING

[75] Inventor: Charles S. Weaver, Palo Alto, Calif.

[73] Assignee: Digital Recording Research Limited Partnership, Menlo Park, Calif.

[21] Appl. No.: 623,342

[22] Filed: Jun. 22, 1984

[51] Int. Cl.[3] ............................................. H03K 13/24
[52] U.S. Cl. ................................ 340/347 DD; 235/310
[58] Field of Search ................. 340/347 DD, 825.02, 340/825.04; 358/260, 261; 235/310, 311

[56] References Cited

U.S. PATENT DOCUMENTS

| 3,252,142 | 5/1966 | Takenaka | 340/825.02 |
| 3,918,047 | 11/1975 | Denes | 340/347 DD |
| 4,396,906 | 8/1983 | Weaver | 340/347 DD |

*Primary Examiner*—Charles D. Miller

*Attorney, Agent, or Firm*—Victor R. Beckman

[57] ABSTRACT

Method and apparatus for decoding Huffman encoded words are disclosed which include the use of logic gates connected in the form of a binary decoding tree which includes branches, interior and leaf nodes. Bits of the encoded word are sequentially supplied to gates of the binary tree. Simultaneously, gate enable signals are supplied to gates of the binary tree. Both the data bits and enable signals are supplied to gates at increasingly higher levels of the binary tree. When an output is obtained from a gate associated with one of the leaf nodes of the tree, the process of sequentially supplying data bits and enable signals to gates of the binary tree is repeated for the next encoded word. The original data words are regenerated by use of outputs from said gates associated with leaf nodes of the binary tree.

19 Claims, 6 Drawing Figures

METHOD AND APPARATUS FOR DIGITAL HUFFMAN DECODING

TECHNICAL FIELD

This invention relates to digital data compression systems and apparatus and method for decoding Huffman encoded signals for use therein.

BACKGROUND OF THE INVENTION

Compression of fixed word length digital data by Huffman encoding is known as disclosed in an article by D. A. Huffman entitled, "A Method for the Construction of Minimum Redundancy Codes." Proc. IRE, 40: 1098, 1952. A Huffman code has the property that two or more code words cannot be placed in sequence to generate another member of the code-word set. This property makes it possible to find the beginning and end of each code word when the word length is variable without an end-of-word symbol. The average number of bits per code word is no greater than one plus the entropy of the source.

Truncated Huffman encoding also is well known. With a truncated Huffman code, code words are assigned to only a relatively small number of the most probable values of digital data to be encoded. For all other values, the actual digital data is transmitted together with a label comprising a Huffman code word. Huffman encoding and decoding method and means are disclosed in U.S. Pat. No. 4,396,906 by Charles S. Weaver, the present inventor.

SUMMARY OF THE INVENTION AND OBJECTS

An object of this invention is the provision of a digital data compression system which includes a novel Huffman decoder.

An object of this invention is the provision of an improved Huffman decoding method and apparatus which may be implemented by use of fixed logic and a minimum number of gates.

An object of this invention is the provision of a Huffman decoder of the above mentioned type which is well adapted for commercial use in a data compression system and may be manufactured at a minimum cost.

The Huffman decoder of the present invention comprises an AND gate network in the form of a Huffman decoding tree. In one form of the invention, the gates are included at nodes of the tree, and in another form they are included at branches thereof. Generally, two gates are included at each level of the Huffman decoding tree, with one gate at a branch node and another at an end node in the one form of the invention. In the other form of the invention, the two gates are included in branches leading to branch and end nodes, respectively. Digits of the Huffman encoded word to be decoded are sequentially supplied to gates at different levels of the Huffman decoding tree. In the one form of the invention, the encoded digits are supplied only to the branch node gate, and in the other form the digits are supplied to both gates at each level. Gate enable signals are supplied to gates in the decoding tree beginning at the lowest level. Decoded signals are provided by outputs from gates at end nodes, or end node branches, of the tree. The decoded signals also provide a reset signal for resetting the system in preparation for another word decoding operation. The decoded signals are converted to binary word form for further processing of the decoded signal information.

BRIEF DESCRIPTION OF THE DRAWINGS

The invention will be better understood from the following description when considered with the accompanying drawings. In the drawings, wherein like reference characters refer to the same parts in the several views.

Figure 1:
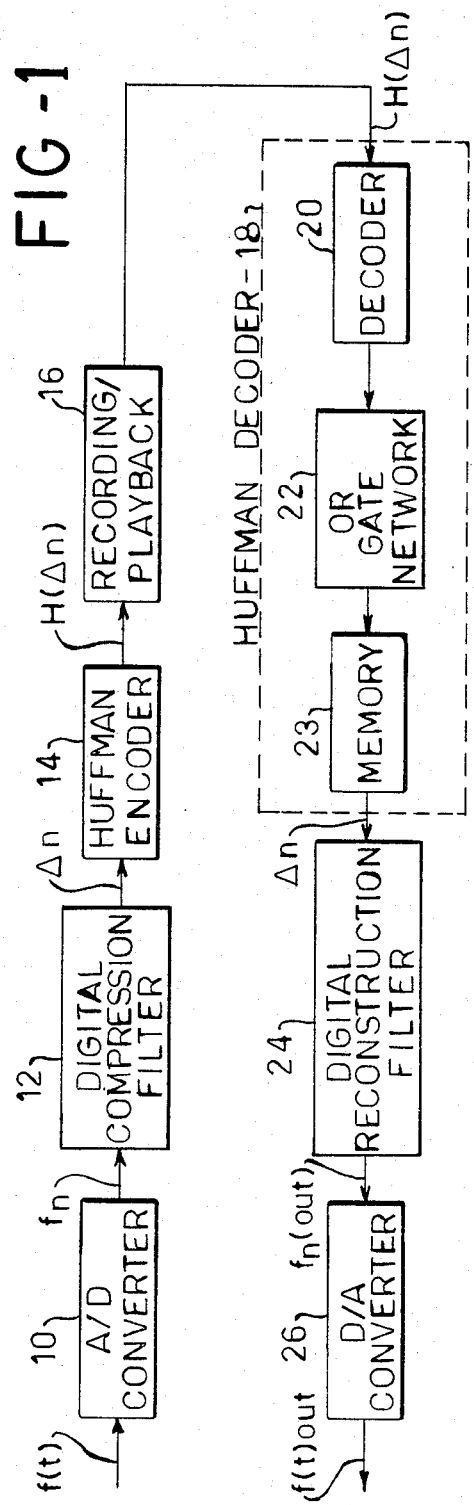
FIG. 1 is a simplified block diagram of a data compression system which includes Huffman encoding and decoding.

Reference first is made to FIG. 1 wherein a data compression system which may employ the Huffman decoder of the present invention is shown to include an analog to digital converter (A/D converter) 10 for conversion of an analog input signal f(t) into digital form, the $n^{th}$ sample from the analog to digital converter being identified as $f_n$. The digital output from the A/D converter 10 is supplied to a digital compression filter 12 where the $f_n$ output of the converter is filtered by a transform, T, and the output of the filter, $\Delta_n$, has an entropy which is less than the entropy of $f_n$. The compression filter 12 output comprises a stream of equal length words, which words have different probabilities of occurrence. The $\Delta_n$ output signals from the digital compression filter 12 are Huffman encoded at Huffman encoder 14. The Huffman encoder output, identified as $H(\Delta_n)$, comprise different length words. A reduction in the total number of bits in the encoded signal stream from the Huffman encoder over the input signal stream to the encoder is achieved by using the shortest code words to encode the most frequently occurring values of $\Delta_n$.

The encoded signal stream from Huffman encoder 14 are shown recorded at recording/playback unit 16. At playback, the Huffman encoded signals $H(\Delta_n)$ from the recording/playback unit are decoded at a Huffman decoder 18 which includes a decoder 20 embodying the present invention. The output from decoder 20 comprises a single binary signal at one of plurality of different output lines, each of which lines represents a single decoded word. In the illustrated system, an OR gate network 22 and memory 23 converts the output from the decoder 20 into binary word form. The Huffman decoder 18 converts the Huffman code words $H(\Delta_n)$ to the original compressed signals $\Delta_n$.

The compressed signals $\Delta_n$ from the Huffman decoder 18 are supplied to a reconstruction, or decompression, filter 24 for conversion of the compressed signals to equal length sample signals $f_n(out)$. The reconstruction filter 24 is an exact, or substantially exact, inverse of compression filter 12 for exact, or nearly exact, reconstruction of the input sample signals $f_n$ supplied to the digital compression filter 12. A digital to analog converter (D/A converter) 26 converts the signal samples $f_n$(out) from the digital reconstruction filter 24 to analog form.

As noted above a Huffman code has the property that two or more code words can not be placed in sequence to generate another member of the code-word set. The following table is an example of a Huffman code that will be used to illustrate the invention.

TABLE 1

| EXAMPLE OF A HUFFMAN CODE | |
|---|---|
| Uncoded Symbol | Code Word |
| S1 | 1 |
| S2 | 00 |
| S3 | 011 |
| S4 | 0100 |
| S5 | 0101 |

The uncoded binary values identified in the table by the symbols S1, S2, S3, S4 and S5 are encoded by the corresponding code word in the table. In the data compression system shown in FIG. 1 the uncoded symbols could be the possible binary values of the output $\Delta_n$ from the digital compression filter 12, which output comprises equal length binary words. For example, if the sequence S1, S3, S2, S4, and S5 is to be encoded by the Huffman encoder 14, the encoded bit stream from the encoder will be 1 011 00 0100 0101.

Figure 2:
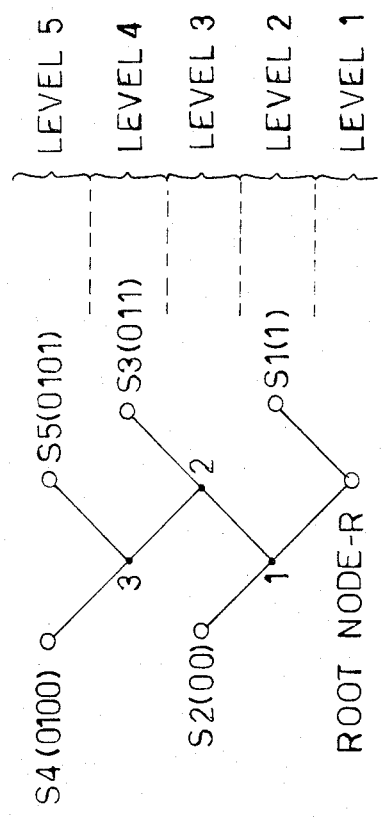
FIG. 2 shows a binary Huffman decoding tree upon which Huffman decoders shown in FIGS. 3 and 5 are based.

The decoder operation can be visualized as the Huffman decoding tree shown in FIG. 2. There, a rooted, binary, tree is shown comprising a root, or start, node R at level 1 of the tree. The first bit in the encoded signal stream is entered at the start node R. If the bit is a 1, the right branch is traversed, and if it is a 0, the left branch is traversed. In the example bit stream, above, the first bit is a 1, and the right branch is followed. This branch terminates in a leaf, or end node, S1.

From a leaf, or end node, the path of travel returns to the root node R, and the next bit, which is a 0, is entered into the tree, which means that the left branch is traversed. This time, an interior, or branch, node 1 is encountered. The third bit (second bit of the second encoded word) is a 1, so the right hand branch from node 1 is followed to node 2, another interior, or branch, node. The fourth bit also is a 1 so that the right hand branch from node 2 is followed to leaf, or end, node S3. As noted above, from end nodes, the root node is reentered for decoding of the next variable length word. In this case the next bit, 0, followed by a 0, causes the path to exit at end point S2. Encoded words 0100 and 0101 next entered into the tree exit at S4 and S5, respectively.

Figure 3:
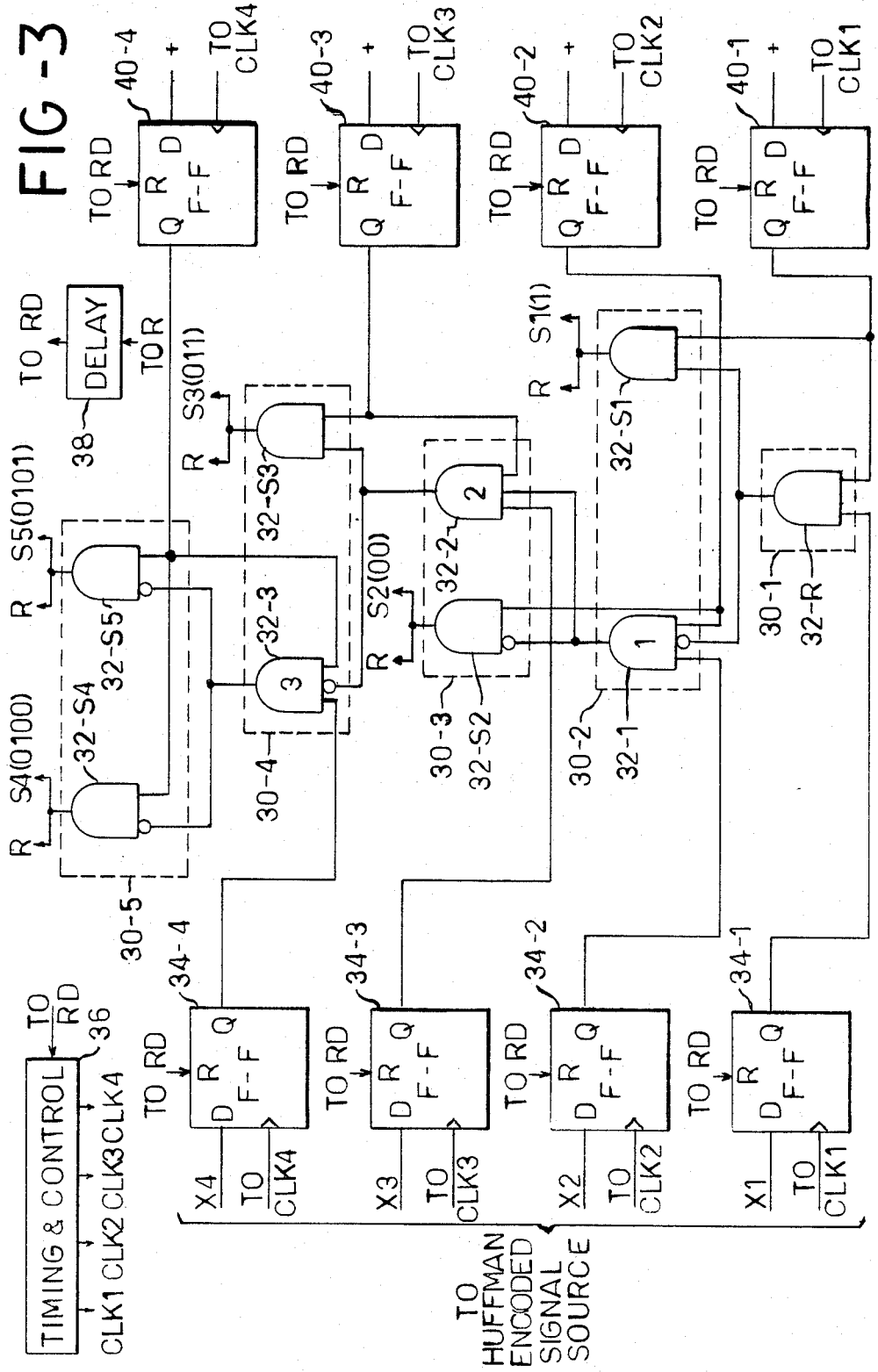
FIG. 3 is a block diagram showing a novel Huffman decoder which includes AND gates at nodes of the tree shown in FIG. 2.

Reference now is made to FIG. 3 wherein a circuit which may be used to implement the logic represented by the Huffman decoder tree of FIG. 2 is shown. In the FIG. 3 arrangement, AND gates correspond to nodes of the tree, and five groups of AND gates at the five levels of the tree are shown which groups are identified by reference characters 30-1 through 30-5. Group 30-1 comprises a single AND gate 32-R corresponding to the root node R in the decoding tree. Group 30-2 includes AND gates 32-1 and 32-S1 which correspond to the branch and end nodes 1 and S1 at level 2 of the decoding tree. Similarly, groups 30-3 and 30-4 include pairs of gates which correspond to branch and end nodes; the gates or group 30-3 being identified by reference characters 32-2 and 32-S3, and the gates of group 30-4 being identified by reference characters 32-3 and 32-S4. The highest level group 30-5 of gates at level 5, includes two end gates 32-S4 and 32-S5 corresponding to leaves S4 and S5 of the binary tree.

The Huffman encoded signals are supplied to the decoding tree by means of a register or a plurality of flip-flops. In FIG. 3 a plurality of flip-flops 34-1 through 34-4 are shown. The bits X1, X2, X3, and X4 of the Huffman encoded signal are supplied as data input signals to the flip-flops 34-1, 34-2, 34-3 and 34-4, respectively, from a source of Huffman encoded signals, not shown. With the Huffman code illustrated in Table 1 wherein the Huffman encoded words vary in length from one to four bits, one to four of the flip-flops are used for decoding the Huffman encoded word, depending upon the word length of the Huffman encoded signal.

The Q outputs from the flip-flops 34-1 through 34-4 are connected to the AND gate groups 30-1 through 30-4, respectively, of the decoding tree. The Q output from the first flip-flop 34-1 is connected to the root gate 32-R, and the Q outputs from the 2nd, 3rd and 4th flip-flops 34-2, 34-3 and 34-4, are connected to the branch node gates 32-1 through 32-3. Clock signals CLK1 through CLK4 are supplied to the flip-flops 34-1 through 34-4 from a timing and control unit 36. Clock signals are sequentially supplied to the flip-flops, starting with flip-flop 34-1 and continuing until the word is decoded, as indicated by an output from one of the leaf, or end node, gates 32-S1 through 32-S5. The decoded signal outputs from the leaf, or end node, gates 32-S1 through 32-S5 are identified by the uncoded symbols S1, S2, S3, etc. together with the associated code word 1, 00, 011, etc.

Delayed decoded signal outputs function as reset signals for resetting the timing and control unit 36 and flip-flops included in the decoder. The reset signal outputs from the leaf nodes of the decoding tree are identified by reference character R. The R (reset) outputs are supplied to a delay unit 38 for the production of delayed reset signals, RD which, in turn, are supplied to the timing and control unit 36 and to flip-flops, including flip-flops 34-1 through 34-4, to reset the same whenever a Huffman encoded word has been decoded.

Gates included in the AND gate decoding tree are selectively enabled during decoding by use of another register, or set of flip-flops. In FIG. 3, flip-flops 40-1 through 40-4 are shown which include data input terminals, D, which are connected to a positive d-c source. The same clock signals CLK1 through CLK4 which are supplied to the data flip-flops 34-1 through 34-4 also are supplied to the gate enable flip-flops 40-1 through 40-4, respectively. The Q outputs from the flip-flops 40-1 through 40-4 are connected to selected gates of the decoding tree to selectively enable the same. As seen in FIG. 3, the Q output from flip-flop 40-1 is connected to the root gate 32-R at level 1 and the leaf gate 32-S1 at level 2. The Q output from flip-flop 40-2 is connected to the branch gate 32-1 of the level 2 group of gates, and the leaf gate 32-S2 to enable the same when the flip-flop is clocked. Similarly, the Q output from flip-flop 40-3 enables gates 32-2 and 32-S2 upon clocking thereof. In the FIG. 3 arrangement wherein both AND gates in group 30-5 comprise leaf gates, both gates 32-S4 and 32-S5 are enabled, together with branch node gate 32-3 at level 4, when flip-flop 40-4 is clocked. Delayed reset signals RD serve to reset the gate enabling flip-flops 40-1 through 40-4 simultaneously with the resetting of the input data flip-flops 34-1 through 34-4.

Although the operation of the decodes of FIG. 3 is believed to be apparent from the above description, a brief description thereof with reference to the timing diagram of FIG. 4 now will be given. At time T0 all of the flip-flops are shown to be in the reset condition whereby the Q outputs therefrom are LOW (0) and, consequently, the outputs from all of the leaf gates 32-S1 through 32-S5 are LOW. The first Huffman encoded signal to be decoded is a 1 as shown by the high input to flip-flop 34-1. With the first clock pulse at time T1, which is supplied to flip-flops 34-1 and 40-1, the outputs from these flip-flops change from LOW to HIGH. The output from root gate 32-R thereupon goes HIGH, whereupon the AND gate 32-S1 output S1(1) also goes HIGH. The output from AND gate 32-S1 is supplied to the delay unit 38 for generation of a delayed reset pulse RD at time T2 which, in turn, resets the timing and control unit 36 and all of the circuit flip-flops.

The next Huffman encoded word, 00, as indicated by X1=0 and X2=0, is supplied to the D inputs of data flip-flops 34-1 and 34-2. Now, at time, T3, a clock pulse from CLK1 is supplied to flip-flops 34-1 and 40-1 whereupon the output from flip-flop 34-1 remains LOW while the output from flip-flop 40-1 changes from LOW to HIGH. This time, the AND gate 32-R output remains LOW, which LOW signal is supplied to the inverting input of AND gate 32-1. Clock pulse CLK2 at time T4 clocks both flip-flops 34-2 and 40-2 whereupon the Q output from flip-flop 34-2 remains LOW, and the Q output from flip-flop 40-2 goes HIGH to enable AND gates 32-1 and 32-S2. The output from AND gate 32-S2 remains LOW since the data input thereto from flip-flop 34-2 remains LOW. With a LOW at the inverting input to AND gate 32-S2, and a HIGH at the other, enable, input thereto, the output from AND gate 32-S2 goes HIGH to produce an S2(00) output. At time T5 the flip-flops 34-1 through 34-4 and 40-1 through 40-4 are reset, as is the timing and control unit 36, by a delayed reset signal, RD, from delay unit 38, as the result of a reset signal, R, supplied to the delay unit from AND gate 32-S2.

The following Huffman encoded word, 011, is supplied to the D inputs of flip-flops 34-1, 34-2 and 34-3, and the data flip-flops are sequentially clocked by clock signals CLK1 through CLK3 to read the data into the decoding tree. Simultaneously with operation of the data flip-flops, the flip-flops 40-1 through 40-3 are clocked to progressively enable an increasing number of gates in the decoding tree. With the third clock pulse CLK3 at time T8, the inputs to AND gate 32-S3 are HIGH whereupon the output therefrom also goes HIGH for production of an S3(011) signal. After resetting, at T9, the Huffman encoded word 0101 is supplied as data input to flip-flops 34-1 through 34-1. Following sequential clocking of the data flip-flops (34-1 through 34-4) together with the enable flip-flops (40-1 through 40-4) leaf AND gate 32-S5 output goes high for production of an S5(0101) signal at time T13.

Figure 5:
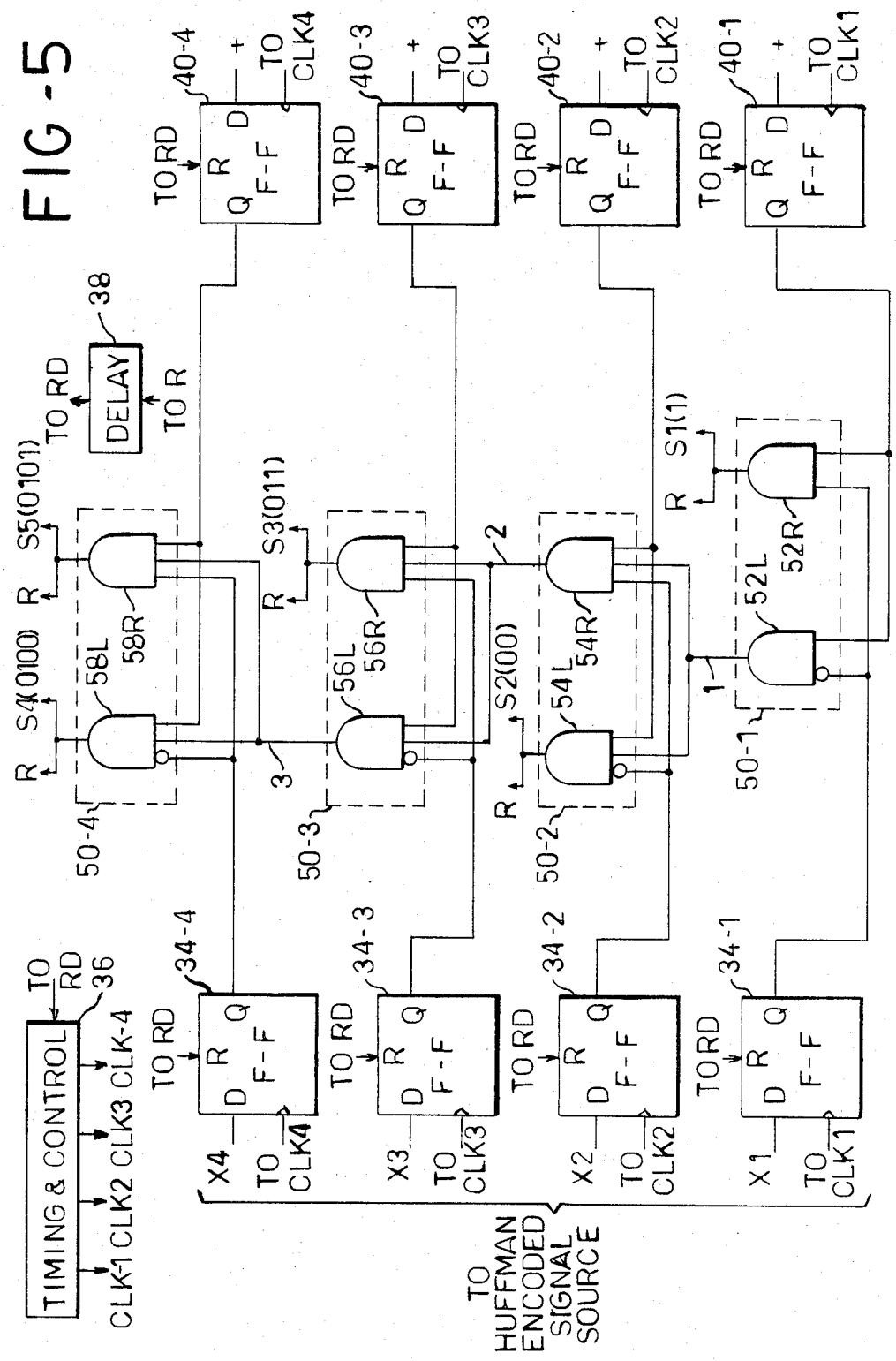
FIG. 5 is a block diagram showing a modified form of novel Huffman decoder which includes AND gates at branches of the tree shown in FIG. 2.

Reference now is made to FIG. 5 wherein a modified form of Huffman decoding network is shown wherein AND gates are employed at positions corresponding to branches, rather than nodes, of the decoding tree shown in FIG. 2. The decoding network shown in FIG. 5 comprises groups of AND gates 50-1 through 50-4 at different levels of the decoding tree, each of which groups comprises two AND gates. Group 50-1 includes AND gates 52L and 52R corresponding to the left and right branches from the root node R of the decoding tree shown in FIG. 2. Group 50-2 includes AND gates 54L and 54R corresponding to the left and right branches from interior node 1 of the decoding tree. Similarly, group 50-3 includes left and right branch gates 56L and 56R, and group 50-4 includes left and right branch gates 58L and 58R. Connections 1, 2 and 3 between adjacent groups of AND gates correspond to interior nodes 1,2, and 3 of the decoder tree shown in FIG. 2.

The decoder of FIG. 5 includes data input flip-flops 34-1 through 34-4, and gate enable flip-flops 40-1 through 40-4 of the same type shown in FIG. 3 and described above. In FIG. 5, the Q outputs from the data input flip-flops 34-1 through 34-4 are connected to both AND gates in the associated group 50-1 through 50-4, respectively. Similarly, the Q outputs from the gate enable flip-flops 40-1 through 40-4 are connected to both AND gates in the associated group 50-1 through 50-4.

Decoded outputs S1(1), S2(00), S3(011), S4(0100), and S5(0101) are obtained from AND gates 52R, 54L, 56R, 58L and 58R, respectively. As with the FIG. 3 arrangement, the decoded outputs are supplied to a delay unit 38 for production of a delayed reset signal, RD, whenever a Huffman encoded word has been decoded for resetting the timing and control unit 36 and the circuit flip-flops 34-1 through 34-4 and 40-1 through 40-4. In operation, gates are sequentially enabled and, simultaneously, individual bits of the Huffman encoded word are supplied to the network, by means of the gate enable and data flip-flops and sequential clock signals supplied thereto, until a decoded output is produced.

Figure 4:
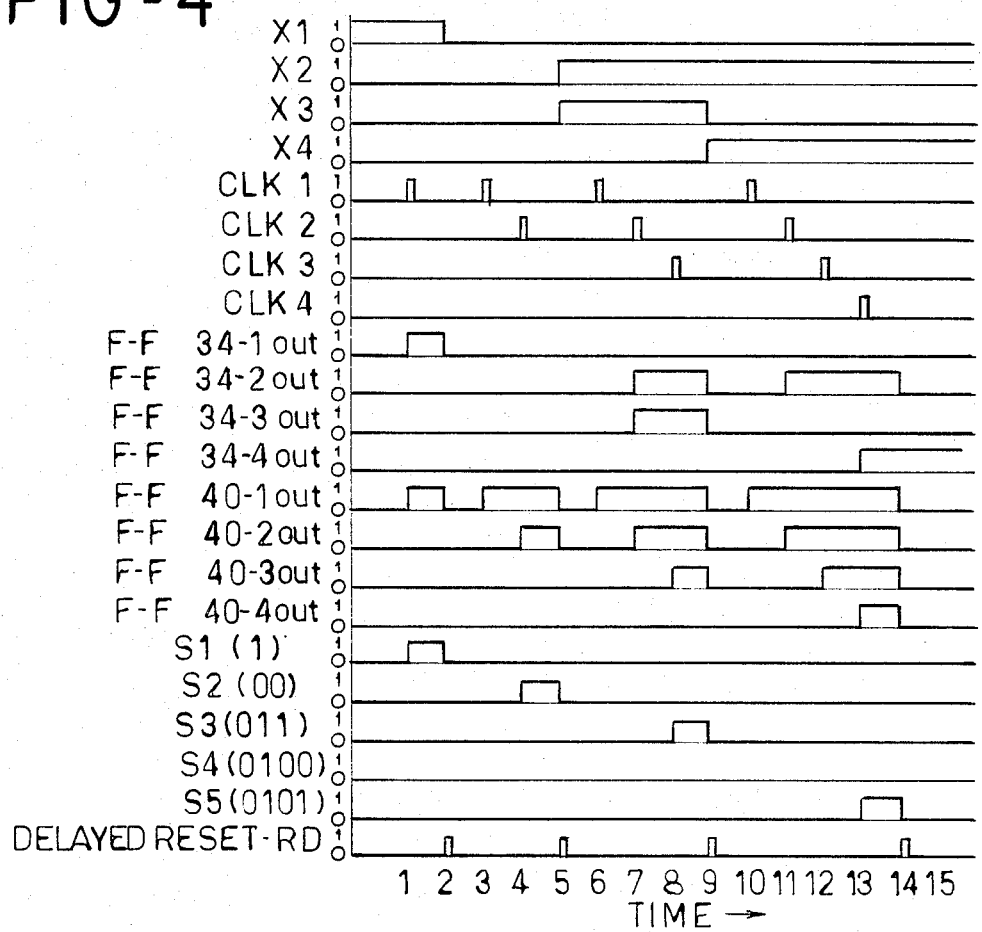
FIG. 4 is a timing diagram for use in explaining operation of the Huffman decoders shown in FIGS. 3 and 5.

The timing diagram shown in FIG. 4 for use in explaining the operation of the decoder of FIG. 3 also may be used in explaining the operation of decoding circuit shown in FIG. 5. At time T0 an encoded input signal of 1 is supplied to the D input of flip-flop 34-1. When flip-flops 34-1 and 40-1 are clocked by clock signal CLK1 at time T1, gates 52L and 52R are enabled by the Q output from flip-flop 40-1. The output from right gate 52R switches from LOW to HIGH for production of an output S1(1) therefrom. The S1(1) output also is supplied to delay unit 38 as a reset signal R, and the delayed reset signal, RD, from the delay unit 38 resets the circuit in preparation for the next encoded word, 00. This input results in an output from gate 54L at the second clock signal (at time T4) after data input and gate enable signals have been supplied to AND gate groups 50-1 and 50-2. After resetting of the circuit, the encoded word 011 is supplied to the data input lines X1, X2, and X3, the data is sequentially read into the decoding tree by sequential clocking of flip-flops 34-1, 34-2 and 34-3 at the same time that AND gate groups 50-1, 50-2 and 50-3 are enabled by outputs from flip-flops 40-1, 40-2 and 40-3. At the third clock signal CLK3 (at time T8) all three inputs to AND gate 56R are HIGH whereupon the gate output changes to a HIGH state for production of an S3(011) output therefrom, after which the circuit is reset. For the fourth input word 0101, AND gates at all levels of the AND gate network are enabled by successive application of enable signals thereto at times T10, T11, T12, and T13. At time T13 the three inputs at gate 58R are HIGH for production of an S5(0101) output signal therefrom.

From the above, it will be seen that the AND gate network included in the Huffman decoders of FIGS. 3 and 5 is made up of four AND gate configurations, two of which gates have two inputs, and two of which have three inputs. One of the two input AND gates includes two non-inventing inputs while the other two-input AND gates includes one inverting and one non-inverting input. One of the three-input AND gates includes all non-inverting inputs while the other three-input AND gate includes two non-inverting and one inverting input. It will be seen that the arrangement of FIG. 5 includes more three-input AND gates than the arrangement of FIG. 3.

The next stage in the decoding process involves converting the individual outputs S1, S2, etc. back into binary form. One method for converting the individual outputs into binary form includes scanning the end-point gate outputs to determine which gate is HIGH. This signal input to a computer then may be used to point to the computer memory location that contains the decoded binary number. This is a practical scheme when the number of end point gates is small. However, it is less practical when the number is large because of the scanning time and hardware requirements when there is a large number of computer inputs.

Figure 6:
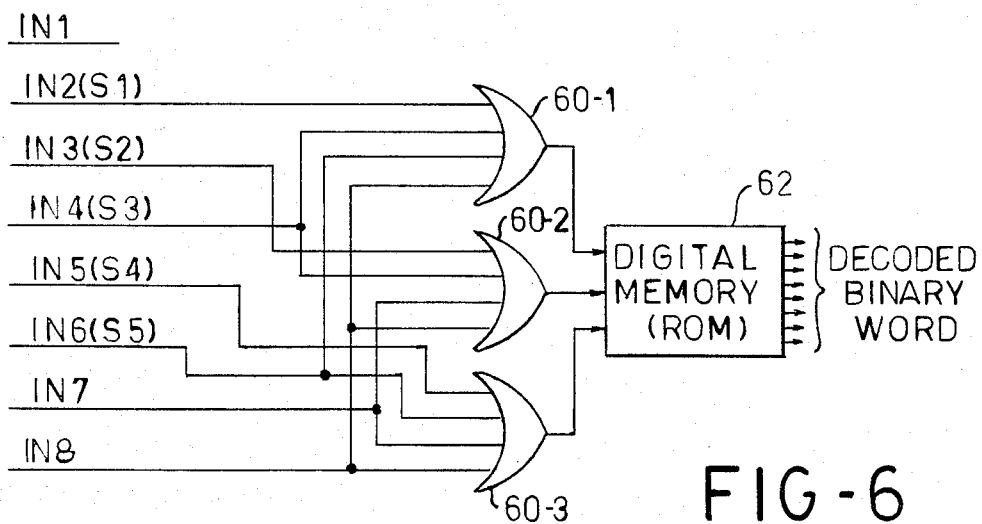
FIG. 6 is a diagram of an OR gate network for use in converting the individual output signals from the Huffman decoders of FIGS. 3 and 5 into binary form.

An OR gate network that produces a binary number that identifies which one of a plurality of input signals is HIGH is shown in FIG. 6, which network may be employed in the present invention. The number of OR gates, n, required to implement a system which includes N input lines may be determined as follows:

If $2^{n-1} < N \leq 2^n$
then n OR gates are required.

In FIG. 6, a network of three OR gates 60-1, 60-2 and 60-3 are required for a system having eight (8) inputs IN1 through IN8. To convert the five input signals S1 through S5 from the decoders of as shown in FIGS. 3 and 5, only five of the inputs are employed.

For eight inputs, the one OR gate 60-3 is connected to the last half of the inputs i.e. inputs IN5, IN6, IN7 and IN8. The OR gate 50-2 is connected to the last half of the end points in the first half and to the last half of gates in the last half, i.e. inputs IN3, IN4, IN7 and IN8. The third OR gate 60-1 is connected to every other input i.e. inputs IN2, IN4, IN6 and IN8. If, for example input IN6 is HIGH, then outputs from OR gates 60-1, 60-2 and 60-3 will be 101. The binary output from the OR gates is input as the address of a code conversion memory 23, such as a ROM, where the memory location that is addressed contains the decoded binary word.

In general, the OR gates are connected as follows. The OR gate at one end of the array is connected to the last half of the end-point gates of the decoding tree. The end point gates are divided in half and the next OR gate is connected to the upper half of each half. The halves are divided into quarters and the next OR gate is connected to all of the end-point gates in upper halves of the quarters. This process is repeated until there are only two end-point gates in each group. Then the last OR gate is connected to each even-numbered end-point gate.

If N (the number of end-point gates) does not equal a power of 2, the connections can be determined by adding "dummy" end-point gates and then use the above scheme. Connections to the "dummy" gates are then eliminated.

The invention having been described in detail, various other changes and modifications will suggest themselves to those skilled in this art. Because the set of code words chosen to illustrate the invention (see table 1) includes a code word which is one bit in length (1), the output S1(1) could be obtained directly from the first flip-flop 34-1 rather than an end-point gate as shown in FIGS. 3 and 5. Thus, in the FIG. 3 arrangement, the Q output from the first data flip-flop 34-1 may be directly connected to the inverting input of interior gate 32-1, to the R terminal of delay unit 38, and to the S1(1) output terminal of the decoder. AND gates 32-R and 32-S1, together with the first enable flip-flop 40-1 then may be eliminated from the circuit.

Similarly, in the FIG. 5 arrangement, AND gates 52L and 52R, together with gate enable flip-flop 40-1 may be deleted from the circuit. In this arrangement, the Q output from the first data flip-flop 34-1 then is connected to the center input of AND gate 54L through a NOT gate. Said Q output from flip-flop 34-1 also is directly connected to the R input terminal of delay unit 38 and to the S1(1) output terminal.

Also, it will be apparent that the Huffman decoders of the present invention may be used for decoding truncated Huffman codes. With a truncated Huffman code, code words are assigned to only a relatively small number of the most probable values of digital data to be encoded and for all other values the actual digital data is transmitted together with a code word label. In decoding a truncated Huffman encoded signal stream, the code word label is stripped from the actual signal value, and the actual signal value, without the label, is properly inserted into the decoded binary signal stream from the digital memory 23. Also, as noted above, registers may be used in place of flip-flops 34-1 through 34-4 and 40-1 through 40-4, if desired, for supplying data bits and gate enable signals to gates of the binary decoding tree. It is intended that the above and other such changes and modifications shall fall within the spirit and scope of the present invention as defined in the appended claims.

I claim:

1. In a digital decoder for decoding encoded digital data words which have been encoded using a code comprising a plurality of different length code words, said decoder comprising a plurality of logic gates connected in the form of a binary decoding tree having branches and interior and leaf nodes, means for supplying bits of encoded digital data words to gates of the tree, said bits being supplied to gates at different levels of the tree dependent upon the position of the bit in the encoded word, a plurality of gate enable lines coupled to gates at different levels of the tree for selectively enabling said gates, different gate enable lines being connected to different gates of the tree, means for sequentially supplying said gate enable lines with gate enable signals for sequentially enabling gates of the tree, an increasing number of gate enable lines being simultaneously supplied with gate enable signals as gate enable signals are sequentially supplied to said gate enable lines, outputs from gates associated with leaf nodes of the binary decoding tree being indicative of the digital data word.

2. In a digital decoder as defined in claim 1 including means responsive to outputs from said gates associated with leaf nodes of the binary tree for regenerating the digital data word.

3. In a digital decoder as defined in claim 2 wherein said means responsive to outputs from gates associated with leaf nodes of the tree comprise an OR gate array having inputs to which outputs from said gates associated with leaf nodes are connected, and
code conversion means for converting the output from the OR gate array to decoded digital data words.

4. In a digital decoder as defined in claim 3 wherein said code conversion means comprises a digital memory addressed by the OR gate array output, decoded digital data words being obtained from the data output of the digital memory.

5. In a digital decoder as defined in claim 1 wherein said means for supplying bits of encoded digital data words to gates of the tree comprise a plurality of flip-flops having inputs connected to a source of encoded digital data words, and
means for sequentially clocking said flip-flops for sequentially supplying said digital data word bits to gates of said binary decoding tree.

6. In a digital decoder as defined in claim 5 including,
means for resetting said plurality of flip-flops in response to outputs from said gates associated with leaf nodes of the tree.

7. In a digital decoder as defined in claim 1 wherein said means for supplying bits of encoded digital data words to gates of the tree comprise a plurality of flip-flops having inputs connected to a source of encoded digital data words, and
means for sequentially clocking said flip-flops at the same rate at which gate enable signals are sequentially supplied to said gate enable lines for sequentially supplying said digital data word bits to gates of said binary decoding tree.

8. In a digital decoder as defined in claim 1 wherein said logic gates comprise AND gates.

9. In a digital decoder as defined in claim 8 wherein said AND gates are of the two input and three input types.

10. In a digital decoder as defined in claim 1 wherein said gates are associated with nodes of the binary decoding tree.

11. In a digital decoder as defined in claim 1 wherein said gates are associated with branches of the binary decoding tree.

12. In a digital decoder as defined in claim 1 wherein said decoded digital data words comprise Huffman encoded words.

13. In a digital decoder for decoding encoded digital data words which have been encoded using a code comprising a plurality of different length code words, said decoder comprising
a plurality of logic gates connected in the form of a binary decoding tree having branches and interior and leaf nodes,
means comprising a plurality of flip-flops having inputs connected to a source of encoded digital data words for sequentially supplying bits of encoded digital data words to gates of the tree, said bits being supplied to gates at different levels of the tree dependent upon the position of the bit in the encoded word,
means including a plurality of gate enable flip-flops having inputs connected to a d-c source for supplying gate enable signals to gates of the binary decoding tree, and
means for sequentially clocking said gate enable flip-flops for sequentially supplying gate enable signals to gates of said binary decoding tree and enabling an increasing number of gates as an increased number of data bits are supplied thereto, outputs from gates associated with leaf nodes of the binary decoding tree being indicative of the digital data word.

14. In a digital decoder as defined in claim 3 including,
means for resetting said plurality of flip-flops and said plurality of gate enable flip-flops in response to outputs from said gates associated with leaf nodes of the tree.

15. In a method of decoding digital encoded data words which have been encoded using a code comprising a plurality of different length code words, the steps comprising,
supplying bits of the encoded word to logic gates connected in the form of a binary decoding tree having branches and interior and leaf nodes, said bits being entered at increasingly higher levels of the tree with an increase in the number of bits in the code word,
sequentially supplying gate enable signals to logic gates of the binary code tree starting at a low level of the tree, an increasing number of logic gates being simultaneously enabled as an increased number of gate enable signals are supplied to the tree, enabled logic gates at lower levels of the tree remaining enabled so long as the number of gate enable signals supplied to the tree is increasing,
stopping the supply of additional gate enable signals to additional levels of the tree in response to an output from one of said gates associated with a leaf node,
an output from one of said gates associated with leaf nodes of the binary tree being indicative of the original data word.

16. In a method as defined in claim 15 which includes repeating the steps of supplying bits of the encoded word to the logic gates and the sequential supplying of gate enable signals to the logic gates following an output from a gate associated with a leaf node.

17. In a method of decoding as defined in claim 15 including regenerating the digital data words from outputs from said gates associated with leaf nodes of the binary tree.

18. In a method as defined in claim 15 wherein bits of the encoded word are sequentially supplied to logic gates of the tree.

19. In a method as defined in claim 18 wherein the steps of sequentially supplying bits of the encoded word to logic gates and sequentially supplying gate enable signals to logic gates are simultaneously performed.

* * * * *